INVENTOR
STANISLAS TESZNER
BY
Abraham A. Saffitz
ATTORNEY

INVENTOR
STANISLAS TESZNER
BY
Abraham A. Saffitz
ATTORNEY

INTEGRAL GRID AND MULTICHANNEL FIELD EFFECT DEVICES

Filed Feb. 21, 1966 3 Sheets-Sheet 3

INVENTOR
STANISLAS TESZNER
BY
Abraham A. Saffitz
ATTORNEY

United States Patent Office 3,407,342
Patented Oct. 22, 1968

3,407,342

INTEGRAL GRID AND MULTICHANNEL FIELD EFFECT DEVICES

Stanislas Teszner, 49 Rue de La Tour, Paris, France
Filed Feb. 21, 1966, Ser. No. 528,896
Claims priority, application France, Feb. 23, 1965, 6,722
4 Claims. (Cl. 317—235)

This invention relates to power-amplifying field-effect semiconductor devices known as gridistors and comprising inside a wafer of a semiconductor material a number of parallel channels each of substantially triangular cross-section and adapted to be more or less pinched-off by the field effect produced by a grid-shaped gate region surrounding the channels. Semiconductor devices of this kind are disclosed in the U.S. patent application Ser. No. 385,023 filed July 24, 1964 in the name of the present applicant now U.S. Patent No. 3,372,316.

The pinch-off effect experienced by each channel is a centripetal pinch-off from which result the particular advantages of an intrinsically high amplification factor, a low time constant for the gate-channel capacitance, and a low charge carrier transit time in conditions of drain current saturation, in that part of the channel which is responsible for substantially all the resistance thereof. These features are particularly useful for high-frequency operation of the device. However, since the channels must be separated from one another by gaps of very similar length to the bases of their triangular cross-sections, the cross-sectional area of the grid is not used rationally. Moreover a large proportion of the junction areas between the gate region and the source and drain regions, corresponds to the unused areas of the gate adding considerable stray capacitance to both the input and output capacitances, with consequent impairment of the transconductance per unit of cross-sectional area of the gate region and of the merit factor defined by the ratio of the transconductance to the input capacitance.

It is an object of this invention to obviate these disadvantages without giving up the advantages of centripetal pinch-off effect in the operative part of the prior art structure. To this end, laminar pinch-off channels are contrived in the previously unused intervals between the triangular channels, to give a better use of the gate region transverse area due to the combination of centripetal and laminar pinch-off effects.

The invention also covers variants of this structure and manufacturing processes for producing them.

The invention will be better understood, and its features and advantages will be readily appreciated, by the following detailed description, reference being made to the accompanying drawings wherein.

It will be assumed by way of example hereinafter that the prior art structure and the structure according to the invention are both formed in a layer 10 of an n-type semiconductor, for instance, of silicon having a resistivity of from about a few ohms to a few tens of ohms per centimeter, the layer being formed by epitaxial growth on a p-type semiconductor wafer 11 which will hereinafter be called the substrate, the substrate being heavily doped and therefore being of low resistivity of a few hundredths of an ohm per centimeter. Of course, the converse is also possible i.e., an epitaxial p-type layer formed on a heavily doped n-type substrate can be used.

Figure 1:
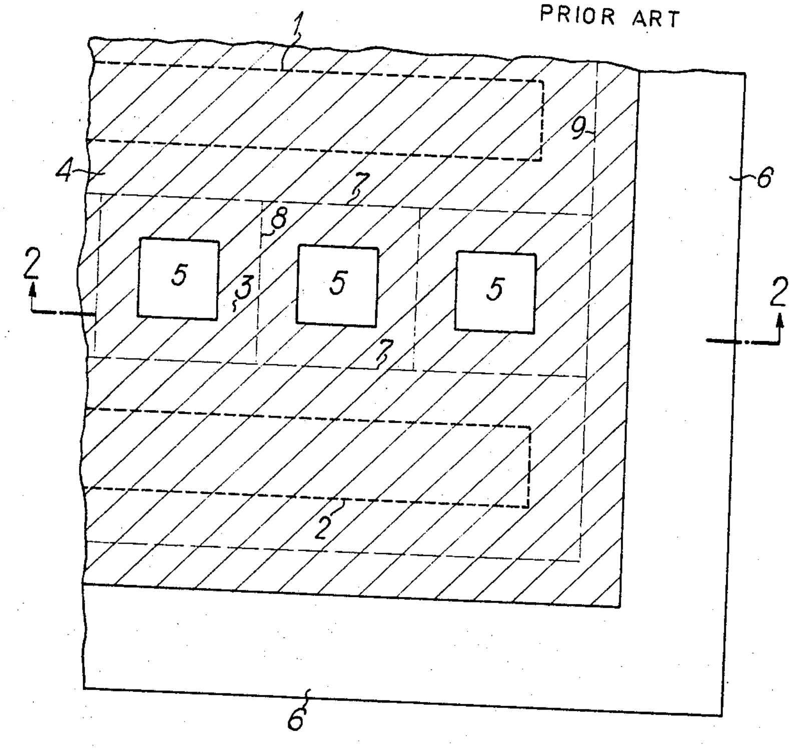
FIGS. 1 and 2 are a plan view and a sectional perspective view, respectively, of a fragment of a prior art structure.
Figure 2:
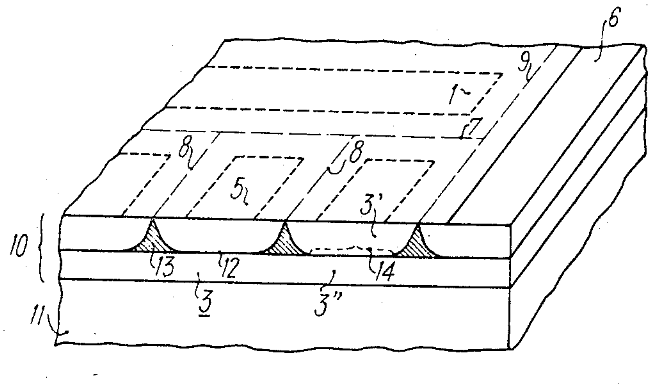
Fig. 2 PRIOR ART

A prior art semiconductor gridistor device is shown in FIGS. 1 and 2. FIG. 1 shows, as well as a gridistor structure, the shape of a surface mask 4, for instance, an oxide mask, which is used for gate diffusion and which is formed on the top surface of the semiconductor wafer. The mask 4 covers the entire surface of the wafer except for windows 5 and a peripheral edging or frame 6. A grid-shaped gate region 3 is formed by a p-type impurity, such as boron, diffusing through the windows 5 and edging 6. Since diffusion is omnidirectional, the gate extends superficially and in depth, some of the superficial extension being below the mask near the edges of the windows 5 and peripheral edging 6. The gate therefore "invades" the area between chain-lines 7 in FIG. 1 and consists in the transverse direction of interconnected portions of varying thickness, maximum thickness occurring opposite the windows 5 and minimum thickness occurring along chain-lines 8 equidistant from two contiguous windows 5, chain-lines 9 equidistant from a window 5 and the edging 6 and chain lines 7.

The structure is shown more clearly in FIG. 2 which is a rear perspective view of a section on the line 2—2 of FIG. 1, like references denoting like elements. There can be seen a semiconductor p-type substrate 11 and an epitaxial n-type layer 10. Diffusion of a p-type impurity introduced externally through the windows 5 and edging 6 has formed the top part 3′ of the gate 3 from top to bottom simultaneously as upwards exodiffusion of the p-type impurity from the heavily doped substrate 11 formed the bottom part 3″ of the gate. These two oppositely diffused parts meet along a level plane 12. The parts 3′, 3″ cooperate to bound substantially triangular n-type channels 13 having two curvilinear sides and one straight side and embedded in the p-type gate 3. The surface junction between the gate portions which have diffused through adjacent windows 5 is along the line 8.

When the gate and the channels have been formed during the diffusion of the p-type impurity, the mask is dissolved and another mask is formed which comprises two windows at the places 1 and 2 in FIG. 1. The epitaxial layer is given an n-type heavy doping through the latter windows, to produce a heavily doped source region 1 and a heavily doped drain region 2. The cathode, anode and gate connecting leads (not shown) are connected to the regions 1, 2 and to the peripheral part of the gate (the region corresponding to the edging 6) or to the substrate.

As can be gathered from FIG. 2, the channels 13 are separated from one another by "dead" intervals or spaces 14 whose length, as stated in the opening part hereof, is of the same order as the straight base of the channels 13. Consequently, the cross-sectional area of the gate is larger than theoretically necessary to apply a pinch-off effect to the channels and produces stray capacitance due to the relatively large surface of the junction between gate 3 and the source and drain regions 1 and 2.

Figure 3:
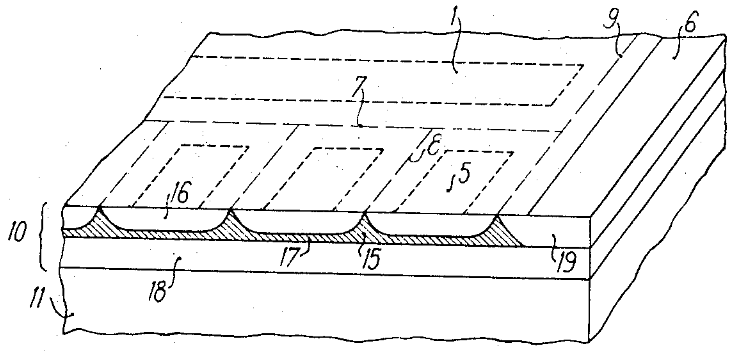
FIG. 3 is a sectioned perspective view of a fragment of a structure according to the invention.

The structure according to the invention, shown in FIG. 3, obviates this disadvantage. Like FIG. 2, FIG. 3 is a perspective view based on a cross-section through the wafer 11. As FIG. 3, shows, the generally triangular channels 15 are not completely separated from one another by the gate 16 but are interconnected by laminar-shaped portions 17. The overall channel is unitary but has a general laminar shape 17 comprising periodic triangular flarings 15. Diffusion of the gate portion 16 through the windows 5 stops before the diffused portion 16 reaches the exodiffused portion 18; only the region of the edging 6 diffuses, as at 19, as far as the exodiffused portion of the substrate 18.

More accurately speaking, the gate region is obtained by two consecutive diffusions. First, the region below the edging 6 is prediffused, whereafter there is a second diffusion step involving the region below the windows 5 and below the edging 6. The same element, for instance boron, is used for both diffusions. The operation is completed by a very brief diffusion of an n-type impurity, for instance, phosphorus, at high concentration through a mask discovering only the source and drain regions 1, 2.

However, the various gate regions in a structure of this kind are not contiguous with the substrate but are separated therefrom by the laminar portion of the channels, and so provision must be made to make the entire volume of the gate unitary and connect it to the substrate. This assumes, as shown in FIG. 3, that the side flanks of the regions diffused through the windows 5 are bound to meet along the lines 8 and that the side flank of the region diffused from the edging 6 meets the side flank of the region diffused from the window 5 along the line 9. However, the side flanks must not go too far beyond the junction position where they meet in the plane of the top surface (FIG. 3); if they do, the areas of the desired flarings are reduced. Therefore the gridistor of FIG. 3 is hard to manufacture.

Figure 4:
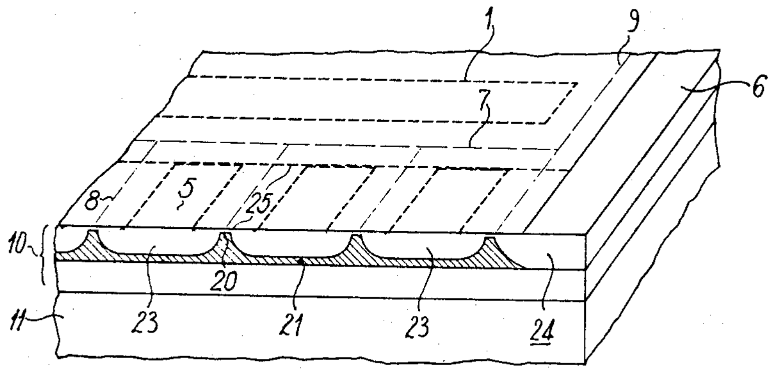
FIG. 4 shows a variant of the structure according to the invention.

The variant shown in FIG. 4 obviates this difficulty. In FIG. 4, flarings 20 are not triangular as in FIG. 3 but are trapezoidal with a chamfered apex; the laminar connecting channels 21 are identical to the laminar channels 17 of FIG. 3. The various portions 23 of the gate 24 are made to interconnect by means of an extra diffusion through a mask pierced with an orifice having the shape of a band or strip or the like 25 interconnecting the windows 5. A very brief p-type diffusion is made through the strip 25, solely with the aim of interconnecting the top zones near the wafer surface of the various gate portions 23. In other words, the chamfered parts of the trapezoidal flarings, instead of being in the plane of the top surface, are slightly below such plane, and a very shallow p-type layer interconnects the separate regions of the gate. Contact with the substrate is by way of the p-type region below the edging 6. In FIG. 4, the band 25 coincides with the aligned sides of the windows 5, but this feature is not essential. The only essential condition concerning the width and position of the band 25 is that it must not exceed the limits indicated by the chain lines 7.

Figure 5:
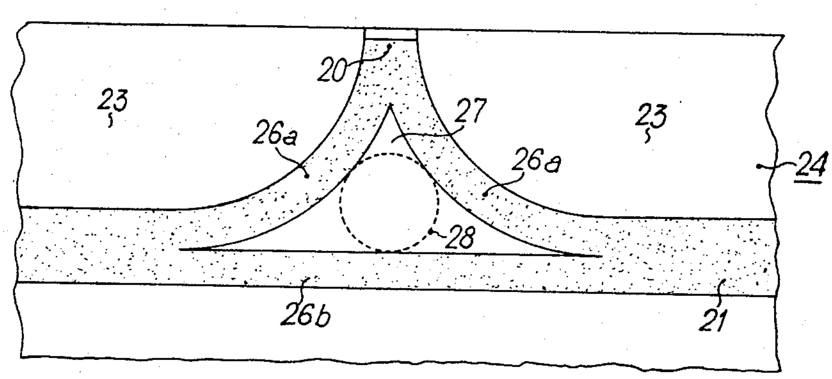
FIG. 5 is a view to an enlarged scale showing space charge development at some time during the elementary pinch-off process of the flared channel according to the invention.

In the structure shown in FIGS. 3 and 4, a very good combined effect is provided of centripetal pinch-off in the quasi-triangular channels with laminar pinch-off in the connecting laminar channels. This combined form of operation can be better understood by reference to FIG. 5 which is a view to enlarged scale showing the development of space charges by field-effect in a channel of the structure in FIG. 5 at a stage in the pinch-off process. The particular stage shown corresponds to the time at which the laminar channels have just been completely invaded by space charges 26*a*, 26*b* which bound, in the triangular channels, a quasi-triangular area 27. The particular time under consideration therefore marks the end of the laminar pinch-off stage, pinch-off then continuing centripetally. The pinch-off voltage for completely pinching-off the channel 27 is in a first approximation the same as that for pinching off the circular channel 28 shown in chain lines in FIG. 5.

The various parts of the gate are interconnected therebetween by those parts thereof which are above the channels as already described and all connected to the substrate by way of the p-type region immediately below the edging 6; since the latter region is obtained by two consecutive diffusions, it is deeper than the other top parts and it is contiguous with the substrate.

Of course, the embodiment and the semiconductor materials used—semiconductors of group IV or intermetallic compounds of groups III and V of the periodic system of the elements, may vary without for that reason the resulting devices departing from the scope of the invention.

What I claim is:

1. Field-effect semiconductor device comprising a semiconductor wafer of a given type of conductivity, a surface layer of the opposite type of conductivity on the central part of one of the faces of the wafer and forming a plane junction therewith, in said surace layer a first source region having the shape of an elongated strip and a second drain region having the shape of an elongated strip parallel with the source strip region, an intermediate gate region in said surface layer delimited and bounded by said source and drain regions, in said gate region third elongated regions forming the gate proper, each having the same type of conductivity as the wafer and substantially a shape of a half-cylinder, said third regions having axes perpendicular to the source and drain strip regions, extending up to one another by their edge portions and to the peripheral part of said wafer, in said gate region a fourth elongated region forming a conductive channel having the opposite type of conductivity to that of the wafer, parallel to the plane junction and contiguous thereto and having a laminar shape with ridged projections each included between two adjacent half-cylinder shaped third regions.

2. Field-effect semiconductor device comprising a semiconductor wafer heavily doped in a given type of conductivity, a surface layer of the opposite type of conductivity on the central part of one of the faces of the wafer and forming a plane junction therewith, said surface layer having a resistivity substantially greater than the resistivity of the wafer, in said surface layer a first source region having the shape of an elongated strip and a second drain region having the shape of an elongated strip parallel with the source strip region, an intermediate gate region in said surface layer delimited and bounded by said source and drain regions, in said gate region third elongated regions forming the gate proper each having the same type of conductivity as the wafer and substantially a shape of a half-cylinder, said third regions having axes perpendicular to the source and drain strip regions, extending up to one another by their edge portions and to the peripheral part of said wafer, in said gate region a fourth elongated region forming a conductive channel having the opposite type of conductivity to that of the wafer, parallel to the plane junction and contiguous thereto and having a laminar shape wih ridged projections each included between two adjacent half-cylinder shaped third regions.

3. Field-effect double gate semiconductor device comprising a semiconductor wafer of a given type of conductivity, a surface layer of the opposite type of conductivity on one of the faces of the wafer and forming a plane junction therewith, in said surface layer a first source region having the shape of an elongated strip and a second drain region having the shape of an elongated strip parallel with the source strip region, a first gate region in said surface layer delimited and bounded by said source and drain regions, in said first gate region third elongated regions forming the first gate proper, each having the same type of conductivity as the wafer and substantially a shape of a half-cylinder, said third regions having axes perpendicular to the source and drain strip regions, extending up to one another by their edge portions, in said first gate region a fourth elongated region forming a conductive channel having the opposite type of conductivity to that of the wafer, parallel to the plane junction and contiguous thereto and having a laminar shape with ridged projections each included between two adjacent half-cylinder shaped third regions whereby said conductive channel is included between said first gate region and said wafer which forms a second gate region.

4. Field-effect double gate semiconductor device according to claim 3 wherein said semiconductor wafer is heavily doped in a given type of conductivity and said surface layer has a resistivity substantially greater than the resistivity of the wafer.

References Cited

UNITED STATES PATENTS

| | | | |
|---|---|---|---|
| 3,274,461 | 9/1966 | Teszner | 317—235 |
| 3,372,316 | 3/1968 | Teszner | 317—235 |

JOHN W. HUCKERT, *Primary Examiner.*

R. F. POLISSACK, *Assistant Examiner.*